US011434913B2

(12) United States Patent
Makarov et al.

(10) Patent No.: US 11,434,913 B2
(45) Date of Patent: Sep. 6, 2022

(54) MULTIPLE PORT VACUUM PUMP SYSTEM

(71) Applicant: Thermo Fisher Scientific (Bremen) GmbH, Bremen (DE)

(72) Inventors: Alexander A. Makarov, Bremen (DE); Wilko Balschun, Bremen (DE)

(73) Assignee: Thermo Fisher Scientific (Bremen) GmbH, Bremen (DE)

( * ) Notice: Subject to any disclaimer, the term of this patent is extended or adjusted under 35 U.S.C. 154(b) by 425 days.

(21) Appl. No.: 16/552,295

(22) Filed: Aug. 27, 2019

(65) Prior Publication Data

US 2019/0383294 A1 Dec. 19, 2019

Related U.S. Application Data

(63) Continuation of application No. 14/459,174, filed on Aug. 13, 2014, now Pat. No. 10,422,338.

(30) Foreign Application Priority Data

Aug. 20, 2013 (GB) ..................................... 1314841

(51) Int. Cl.
*F04D 19/04* (2006.01)
*H01J 49/24* (2006.01)

(52) U.S. Cl.
CPC ......... *F04D 19/042* (2013.01); *F04D 19/046* (2013.01); *H01J 49/24* (2013.01); *Y10T 137/86083* (2015.04)

(58) Field of Classification Search
CPC ........ F04D 19/04; F04D 19/042; F04D 19/02; H01J 49/24

(Continued)

(56) References Cited

U.S. PATENT DOCUMENTS 6,334,754 B1 1/2002 Kabasawa
7,850,434 B2 * 12/2010 Stones .................... F04D 25/00 417/423.4

(Continued)

FOREIGN PATENT DOCUMENTS

CN 1641226 A 7/2005
CN 101124409 A 2/2008

(Continued)

OTHER PUBLICATIONS

Examination Report dated Nov. 24, 2021, to DE Patent Application No. 10 2014 012317.0.

*Primary Examiner* — Peter J Bertheaud
*Assistant Examiner* — Geoffrey S Lee

(57) ABSTRACT

A vacuum pump system for evacuating at least five volumes comprising a turbomolecular pump and a forevacuum pump arranged to pump an output of the turbomolecular pump arrangement to atmosphere. The turbomolecular pump has at least five pumping stages separated by rotor blades. Not more than three pumping stages have pumping speeds in excess of ⅓ of the highest pumping speed when under vacuum and/or a pumping port cross section in excess of ⅓ of the highest pumping port cross section, and at least two pumping stages have pumping speeds less than ¼ of the highest pumping speed when under vacuum and/or a pumping port cross section of less than ¼ of the biggest pumping port cross section. The ratio of pressures between the pumping stage with the highest pressure and the pumping stage with the lowest pressure is at least 100000:1 when under vacuum.

17 Claims, 1 Drawing Sheet

(58) Field of Classification Search
USPC ............................ 417/423.4; 415/1, 90, 143
See application file for complete search history.

(56) References Cited

U.S. PATENT DOCUMENTS

| | | | | |
|---|---|---|---|---|
| 8,106,354 | B2 | 1/2012 | Henry et al. | |
| 8,235,678 | B2 | 8/2012 | Stones | |
| 8,481,923 | B1 * | 7/2013 | Kitamoto | F04D 19/04 250/281 |
| 2010/0176294 | A1 | 7/2010 | Henry et al. | |
| 2011/0286864 | A1 | 11/2011 | Stones | |

FOREIGN PATENT DOCUMENTS

| | | | |
|---|---|---|---|
| CN | 100575711 | C | 12/2009 |
| DE | 10 2008 051 695 | A1 | 4/2010 |
| DE | 102008051695 | A1 | 4/2010 |
| DE | 10 2008 061 805 | A1 | 6/2010 |
| DE | 102008061805 | A1 | 6/2010 |
| DE | 20 2010 017 766 | U1 | 7/2012 |
| DE | 202010017766 | U1 | 7/2012 |
| DE | 20 2013 003 855 | U1 | 7/2014 |
| EP | 2295812 | A1 | 3/2011 |
| EP | 2295812 | A1 | 3/2011 |
| WO | WO-2014173961 | A1 | 10/2014 |

* cited by examiner

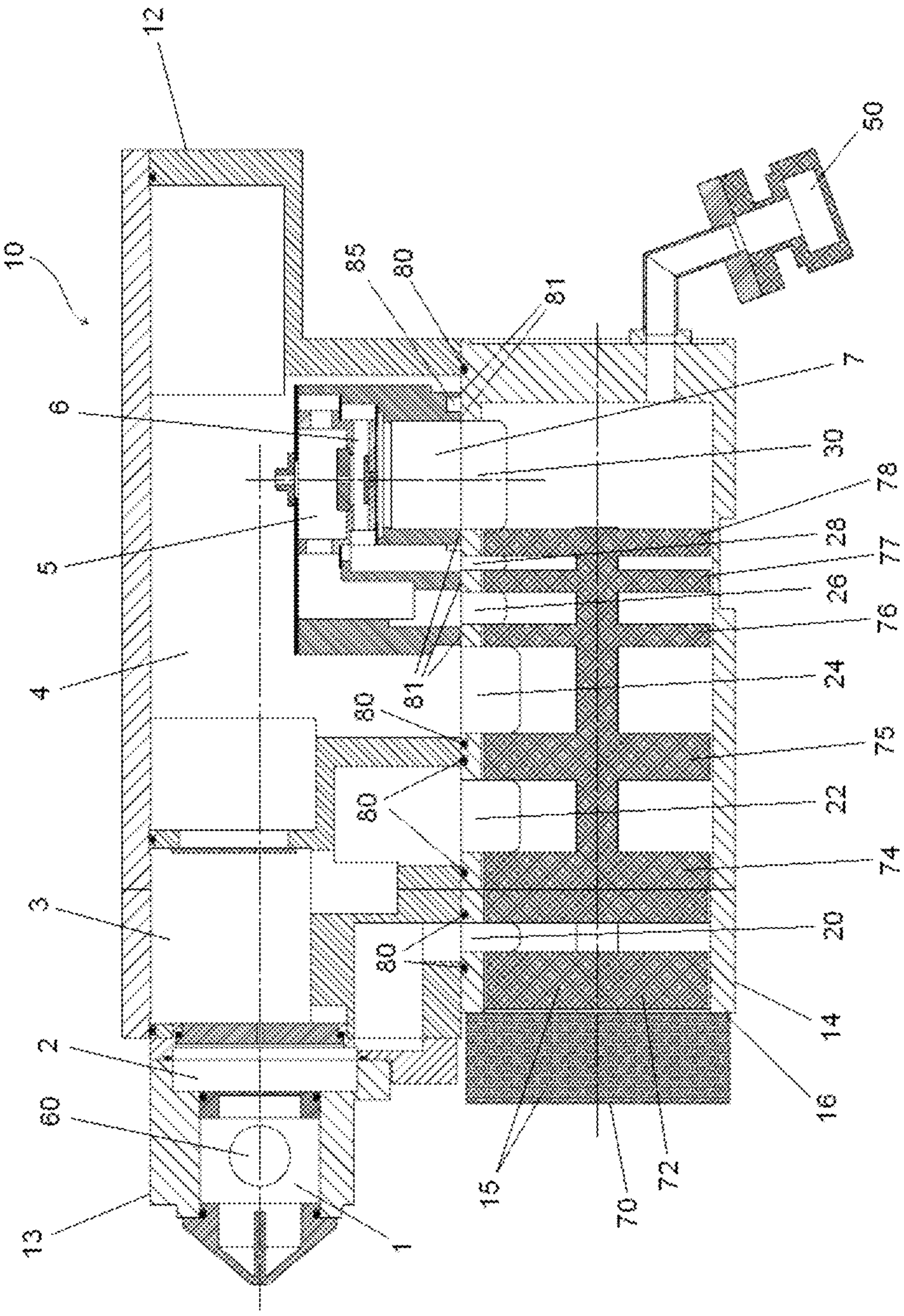
10
12
50
85
80
81
6
7
30
78
28
77
5
26
76
24
81
4
80
75
80
22
74
3
20
80
14
2
16
60
15
70
72
13
1

MULTIPLE PORT VACUUM PUMP SYSTEM

CROSS-REFERENCE TO RELATED APPLICATIONS

This application is a Continuation under 35 U.S.C. § 120 and claims the priority benefit of co-pending U.S. application Ser. No. 14/459,174, filed Aug. 13, 2014. U.S. application Ser. No. 14/459,174, claims priority to GB 1314841.6, which is hereby incorporated herein by reference in its entirety.

FIELD OF THE INVENTION

This invention relates to the field of turbomolecular vacuum pumping systems, especially turbomolecular vacuum pumping systems for scientific instrumentation where the lowest pressure region is below $10^{-9}$ mbar, and in particular for mass spectrometers.

BACKGROUND OF THE INVENTION

Turbomolecular pumps for providing high and ultrahigh vacuums for scientific instrumentation are well known. Herein a vacuum is considered to be within the high vacuum region when the pressure is between $1\times10^{-3}$ and $1\times10^{-9}$ mbar, and is considered to be within the ultrahigh vacuum (UHV) region when the pressure is between $1\times10^{-9}$ and $1\times10^{-12}$ mbar.

Turbomolecular pumps are momentum transfer pumps in which gas molecules entering the pump are given momentum by impact with the moving rotor blades of the pump. The pump contains multiple stages of angled rotor and stator pairs mounted in series. Gas molecules struck by a rotor blade gain momentum and due to the angle of the blade, are given a component of motion parallel to the axis of the pump. The stator blades are stationary and are provided with a different angle with respect to the axis of the pump. The gaps between the stator blades accept the travelling molecules and pass them on to the next rotor blade where a further gain in momentum is provided. Multiple stages increase the pressure of the gas from an inlet to the exhaust of the pump. The turbomolecular pump is only fully effective operating in pressure regions in the molecular flow regime and does not exhaust to atmospheric pressure, but is backed by a forevacuum pump. The working pressure range of the turbomolecular pump is usually extended by coupling a molecular drag pump, such as a Holweck pump, to the exhaust side of the turbomolecular pump within the same pumping housing and driven by the same rotating shaft, enabling lower performance forevacuum pumps to be utilised and to allow oil-free forevacuum pumps to be used. In this case the combination of the turbomolecular pumping stage and the molecular pumping stage exhaust to a pressure of 1 mbar or so, the forevacuum pump exhausting to atmosphere.

Multiple port or split-flow pumps have been developed to enable the pumping of several chambers at different pressures, the pumps containing two to four (typically three) pumping ports spaced along the length of the pump, the length being parallel to the pump axis. The pump is usually composed of a stack of pumping stages including a multi-stage turbomolecular pumping unit and one or more molecular pumping stages, with different pumping ports forming inlets to the pump at different locations along the stack. Typically the highest pumping speed is available at the ultimate pumping port (the main inlet) which provides access to the lowest pressure region of the pump, whilst other pumping ports (further down the stack of pumping stages) are at higher pressures and may provide lower pumping speeds. The pumping speeds in a typical three port pump are often two ports having a similar pumping speed and the highest pressure port having a pumping speed about 1/10 of that of the others. This leads to the disadvantage that the pumping requirements for an analytical instrument are not easily met by a single split-flow pump.

Two slightly different constructions are known: a split-flow pump as disclosed in EP 603694 in which a multi-stage turbomolecular pump having multiple pumping ports is located within a dedicated pump housing, and a so-called cartridge split-flow pump as disclosed in U.S. Pat. No. 6,457,954 B1 in which the pump comprising all the functional elements including an inner housing may be combined into an outer housing adapted to a specific application.

Whilst such split-flow pumps typically comprise a combination of multi-stage turbomolecular pumps and viscous pumping stages, in particular molecular drag pumps, they are sometimes referred to only as turbomolecular pumps. Herein they are referred to as turbomolecular pump arrangements.

US 2010/0098558 A1 discloses a multiple inlet pump arrangement in which at least a first inlet surrounds a second inlet such that the second inlet seals only against the pressure within the first inlet and not against atmospheric pressure. This enables the use of metal-to-metal seals between all inlets that are surrounded by another inlet, and those seals may be of a type which does not cause plastic deformation of the metallic sealing material, eliminating the difficulties found when attempting leak-tight sealing using plastic deformation of multiple seals in parallel.

Broader penetration of mass spectrometry into routine applications is somewhat hindered by the cost and size of vacuum systems, especially for mass spectrometers utilising mass analyzers that operate in the ultrahigh vacuum regime, such as Orbitrap™, multi-reflection and multi-deflection time-of-flight mass analyzers, electrostatic traps, etc., and which incorporate atmospheric pressure ion sources, such as electrospray (ESI), atmospheric pressure chemical ionisation (APCI), matrix-assisted laser desorption/ionisation (AP-MALDI), etc. Prior art split-flow pump arrangements suffer from the disadvantage that only a limited number of stages of differential pressure may be accommodated by the multiple inlet pumps and two or more such pumps, plus one or more forevacuum pumps, are required for the mass spectrometers described above.

It is desirable to be able to pump a scientific instrument, in particular a complete mass spectrometer, by a single split-flow pump.

Against this background the invention has been made.

SUMMARY OF THE INVENTION

The present invention provides a vacuum pump system for evacuating at least 5 volumes comprising a forevacuum pump and a turbomolecular pump arrangement, the system arranged so that the forevacuum pump pumps an output of the turbomolecular pump arrangement to atmosphere; and wherein the turbomolecular pump arrangement comprises multiple pumping ports corresponding to different pumping stages and is configured so that:

there are at least 5 pumping stages, each connected to a volume; each pumping stage is separated by at least one set of rotor blades and preferably at least one set of stator blades; not more than 3 pumping stages have pumping speeds in excess of ⅓ of the highest pumping speed of a pumping stage when under vacuum and/or a pumping port cross section in excess of ⅓ of the highest pumping port cross section; at least 2 pumping stages have pumping speeds less than ¼ of the highest pumping speed of a pumping stage when under vacuum and/or a a pumping port cross section of less than ¼ of the biggest pumping port cross section; wherein the ratio of pressures between the pumping stage with the highest pressure and the pumping stage with the lowest pressure is at least 100000:1 when under vacuum. A forevacuum pump could also comprise several individual pumps connected in series or in parallel to the output of the turbomolecular pumping stage.

In a particularly preferred embodiment of the invention, a vacuum pump system for evacuating at least 5 volumes comprises a forevacuum pump and a turbomolecular pump arrangement, the system arranged so that the forevacuum pump pumps an output of the turbomolecular pump arrangement to atmosphere; and wherein the turbomolecular pump arrangement comprises multiple pumping ports and is configured so that there are at least 5 stages of pumping, each connected to a volume; each stage of pumping being separated by at least one set of rotor and/or stator blades; not more than 3 stages of pumping having pumping speeds in excess of 50 $l \cdot s^{-1}$ when under vacuum; at least 2 stages of pumping having pumping speeds less than 30 $l \cdot s^{-1}$ when under vacuum; when in use at working gas loads the ratio of pressures between any two adjacent turbomolecular pump arrangement pumping stages is between 10 and 1000; and the forevacuum pump when in use maintains the output of the turbomolecular pump arrangement at a pressure of 1 mbar or more.

The present invention provides a way to re-arrange pumping ports of a splitflow turbomolecular pump in such a way that many more ports might be differentially pumped without a substantial change to the length of the pump rotor. The invention provides at least 5 stages of pumping, each connected to a volume, the volume being evacuated by the pumping stage connected to it. The split-flow turbomolecular pump provides pumping stages which are separated from each other by at least one set of rotor and/or stator blades, preferably by at least one set of rotor blades and at least one set of stator blades. By choosing the pumping speeds and/or the pumping port cross sections, advantageously adapting the gaps between the rotor and/or stator blades of adjacent pumping stages according to the specific needs of the intended application, the rotor length of the turbomolecular pump arrangement can be kept short. A short rotor length allows for a high reliability of the pump, in particular when the pump is mounted with a horizontal orientation. Thus, when a number of volumes are pumped by a turbomolecular pump arrangement according to the invention, a reduction in cost compared to the state of the art can be realized without reducing the reliability.

Preferably, at least one pumping stage of the turbomolecular pump arrangement contains a molecular drag pump, in particular a Holweck pump with a helical pump channel. Especially when the pumping stage adjacent to the output of the turbomolecular pump arrangement contains at least one molecular drag pump, it is possible to output the pumped gas at a pressure in excess of 1 mbar to a forevacuum pump. As a result, forevacuum pumps with a comparatively low pumping speed, such as membrane pumps, can be used for pumping the output of the turbomolecular pump arrangement to atmosphere.

The vacuum pump system is preferably used for evacuating a scientific instrument. The scientific instrument comprises a series of chambers or pressure regions, herein referred to simply as volumes, separated by gas flow restrictors, which may be chamber walls, the restrictors containing apertures for communication between the pressure regions. For ease of illustration and without limiting the scope, the invention will herein be described in relation to a mass spectrometer in order to describe its application to a preferred embodiment.

The scientific instrument comprising a mass spectrometer further comprises an atmospheric pressure ion source, a mass analyzer and an ion optical arrangement for transporting ions from the atmospheric pressure ion source to the mass analyzer. The ion source lies outside the vacuum system, and the ion optical arrangement comprises multiple sections, different sections being held in different chambers or pressure regions (i.e. in separate volumes). An enclosure also houses the mass analyzer, and the pressure region within this enclosure at least, is advantageously held at UHV. The chambers or regions containing the ion optical components are preferably held at successively lower pressures from the region adjacent the ion source to the enclosure containing the mass analyzer. The pressure region adjacent the ion source may be at a pressure around 1 mbar and may be evacuated using a forepump. The remaining volume pressures are attained using a single turbomolecular pump arrangement and the total range of pressures must span 8-10 orders of magnitude.

For the preferred embodiment of a mass spectrometer, the inventors realised that apertures in the ion optical components which lie adjacent the connecting pressure regions must be of typically 2-12 $mm^2$ cross sectional area to provide high efficiency transportation of ions, and that this provides a relationship between the gas flow rates and the pressures in the chambers or regions, which may be used to determine critical parameters for the pump. Higher cross sectional area apertures typically correspond to slower moving ions (lower energy ions) and smaller cross sectional area apertures are utilised with higher energy ions. For equivalent gas flow conductivity, the apertures may also be replaced by elongated flow restrictors of larger cross sectional area but longer length, such as may be achieved by placing a multipole within a shroud, for example. As the pressure in almost all chambers or regions except that closest to the ion source is within the molecular flow regime, the ratio of pressures between adjacent chambers or pressure regions may be between 10 and $10^3$, and is typically $10^2$. To span the 8-10 orders of magnitude in pressure requires at least 5 pressure regions, and hence the pumping arrangement of the invention provides at least 5 pumping ports. The compression of gas within the pump must be distributed between these pumping ports according to the required pressures between the pressure regions and according to the gas flow rates through the flow restrictors between the pressure regions which are specific to the mass spectrometer.

It is furthermore desirable to provide a vacuum pumping system for a mass spectrometer which possesses a long service lifetime. The inventors appreciated that increasing the rotor shaft length (i.e. the distance between the rotor at the lowest pressure region of the pump and the bearing on the exhaust side of the pump) decreases the service life of the pump, especially when the pump is oriented with its axis horizontal, which is usually preferable. Hence the invented pumping system preferably limits the greatest distance between any two stages of pumping to be less than 400 mm. In some preferred embodiments the greatest distance between any two stages of pumping is less than 300 mm. As used herein, the term the distance between two stages of pumping refers to the distance from the centre of one pumping stage to the centre of another pumping stage.

According to a particularly preferred embodiment of the present invention, these various requirements are met by limiting the pumping speed such that not more than 3 stages of pumping have pumping speeds in excess of 50 $l \cdot s^{-1}$ when under vacuum, at least 2 stages of pumping have pumping speeds less than 30 $l \cdot s^{-1}$ when under vacuum, and when in use at working gas loads the ratio of pressures between any two adjacent turbomolecular pump arrangement pumping stages is between 10 and 1000, more preferably between 20 and 400. The forevacuum pump when in use in particular maintains the output of the turbomolecular pump arrangement at a pressure of 1 mbar or more.

Preferably the content of helium or hydrogen in any of the stages of pumping does not exceed 10%.

Preferably the volume at the lowest pressure is maintained below $1\times10^{-9}$ mbar, below $5\times10^{-10}$ mbar, in particular below $1\times10^{-10}$ mbar. To achieve these UHV pressures, preferably the volume at the lowest pressure has a heating arrangement for heating the volume so as to outgas the components within it, and does not contain elastomer seals.

In a preferred embodiment at least one pumping port surrounds a second pumping port such that the second pumping port seals against pressure within the first pumping port and not against atmosphere, as described in US 2010/0098558 A1. Alternatively, it is preferred when at least the volume of a first pumping stage surrounds the volume of a second pumping stage such that the volume of the second pumping stage seals against pressure within the first pumping stage and not against atmosphere. Thus a lower final pressure can be attained in the second pumping stage.

The present invention also provides a mass spectrometer system comprising the vacuum pump system of the invention wherein the mass spectrometer system comprises at least 6 volumes, and further comprises an atmospheric pressure ion source, a mass analyzer and an ion optical arrangement for transporting ions from the atmospheric ion source to the mass analyzer; and wherein the forevacuum pump pumps a first volume adjacent the atmospheric pressure ion source, the first volume containing a first stage of the ion optical arrangement; and the turbomolecular pump arrangement pumps further volumes each containing further stages of the ion optical arrangement and the mass analyzer.

Preferably, the mass analyzer is located in the volume with the lowest pressure when under vacuum.

The mass analyzer can preferably be realized as an orbitrap comprising an outer barrel-shaped electrode and a coxial inner spindle-shaped electrode. Ions orbiting in the resulting electrostatic field are detected based on their image current. Alternatively, the mass analyzer could comprise an ion detector such as a secondary electron multiplier, which is connected to a mass filter, such as a linear quadrupole mass filter.

In a preferred embodiment of the invention, the ion optical arrangement contains at least one mass filter, preferably a quadrupole mass filter, and/or at least one ion trap, in particular a linear ion trap, and/or at least one collision cell. This allows for sequential mass spectrometry of large molecules.

Whilst described above in relation to a mass spectrometer, the pumping arrangement of the invention may be applied to other scientific instruments, which may or may not contain ion optical elements.

The invention provides advantages over prior art pumping arrangements. Only one turbomolecular pump is required to evacuate a scientific instrument comprising 5 volumes or more and requiring 5 or more stages of pumping across a pressure range of 8-10 orders of magnitude, saving cost and reducing complexity. The invention provides a single pump suitable for the pumping requirements of a complete mass spectrometer, for example. The entire scientific instrument comprising 5 or more differentially pumped chambers may be evacuated to UHV using the turbomolecular pump and a single forepump. Whilst realising these advantages, the greatest distance between any two stages of pumping is preferably less than 400 mm, or in some cases 300 mm, providing long service lifetime for the pump.

The invention also provides a method of evacuating at least 5 volumes comprising pumping an output of a turbomolecular pump arrangement to atmosphere with a forevacuum pump; and pumping each volume via a respective one of at least 5 pumping stages of the turbomolecular pump arrangement; wherein each pumping stage is separated by at least one set of rotor blades and preferably at least one set of stator blades; not more than 3 pumping stages have pumping speeds in excess of ⅓ of the highest pumping speed when under vacuum; at least 2 pumping stages have pumping speeds less than ¼ of the highest pumping speed when under vacuum; wherein the ratio of pressures between the pumping stage with the highest pressure and the pumping stage with the lowest pressure is maintained at least at 100000:1 when pumping at working gas loads.

Preferably, the invention also provides a method of evacuating at least 5 volumes comprising pumping an output of a turbomolecular pump arrangement to atmosphere with a forevacuum pump; and pumping each volume via a respective one of at least 5 stages of pumping of the turbomolecular pump arrangement; wherein each stage of pumping is separated by at least one set of rotor and/or stator blades; not more than 3 stages of pumping have pumping speeds in excess of 50 $l \cdot s^{-1}$ when under vacuum; at least 2 stages of pumping have pumping speeds less than 30 $l \cdot s^{-1}$ when under vacuum; and wherein at working gas loads the ratio of pressures between any two adjacent pumping stages of the turbomolecular pump arrangement is between 10 and 1000; and the forevacuum pump maintains the output of the turbomolecular pump arrangement at a pressure of 1 mbar or more.

In a preferred embodiment the 5 volumes comprise chambers which house ion optical components of a mass spectrometer.

Further advantages and preferred arrangements will become apparent from the following description and drawing. The invention may be put into practice in a number of ways, some of which will now be described by way of example only and with reference to the accompanying drawing.

DESCRIPTION OF THE FIGURE

FIG. 1 is a schematic cross sectional diagram depicting an embodiment of a pumping system of the present invention in which a cartridge split-flow pump and a concentric pumping arrangement is utilised.

DETAILED DESCRIPTION

FIG. 1 is a schematic cross sectional diagram depicting a pumping system of the present invention in which a cartridge split-flow turbomolecular pump is utilised. A vacuum system 10 comprises a housing 12 for ion optical components (not shown) and a housing 14 for accommodating a cartridge split-flow pump 15. The cartridge split-flow pump 15 is inserted into housing 14 and mates with flange 16.

An atmospheric pressure ion source (not shown) is located outside the vacuum system. The ion source is advantageously based on the ESI (ElectroSpray Ionization) or DART (Direct Analysis in Real Time) technique for creating ions.

Housing 13 encloses a first stage of ion optics which is in a volume 1, which is adjacent to the ion source. Housing 12 encloses all other components of the mass spectrometer. At working gas loads housing 13 is maintained at a pressure 1.5 to 2.5 mbar and is evacuated using a forepump 90 in gas communication with port 60, the forepump operating at 15 $l \cdot s^{-1}$ pumping speed and conducting a gas flow rate of 23-37 $mbar \cdot l \cdot s^{-1}$. In a typical mass spectrometer, volume 1 within housing 13 contains an RF device such as an ion funnel, Step-Wave™ collision guide, S-lens, RF carpet, or other ion optical device for transporting an ion beam at low vacuum. The forepump is in pumping communication with the exhaust of the split flow pump as well as being connected to housing 13 which encloses the first stage of ion optics. Hence the forepump both backs the turbomolecular pump arrangement (the splitflow pump) and the first stage of the ion optics which is located within a first volume 1, and advantageously only two pumps (the forepump and and turbomolecular pump) are needed to evacuate the entire scientific instrument.

Cartridge split-flow pump 15 and housing 14 comprise 6 pumping stages, pumping ports 20, 22, 24, 26, 28 and 30 conducting gas from the remainder of the ion optics and the mass analyser. Each of the stages is connected to volumes within housing 12 via pumping ports.

A molecular drag stage of the split-flow pump is aligned with pumping port 20, evacuating port 20 to a pressure of 0.1 mbar under a gas flow rate of 2 $mbar \cdot l \cdot s^{-1}$ with 20 $l \cdot s^{-1}$ pumping speed. In a typical mass spectrometer, volume 2 connected to this port contains an RF-only transport device such as a multipole or ion tunnel. Depending on the ion source, a gas flow rate of 3-4 $mbar \cdot l \cdot s^{-1}$ can also occur; in principle, a molecular drag stage of a higher pumping speed can be used. The ion source may in particular be of the type described in US 2012/0043460 A1 or US 2012/0153141 A1, and a gas flow rate of up to 8 $mbar \cdot l \cdot s^{-1}$ may occur.

Pumping port 22 is aligned with pumping elements further along the split-flow pump and pumping port 22 is evacuated to $10^{-3}$ mbar with a pumping speed of 150 $l \cdot s^{-1}$ at an incoming gas flow rate of 0.15 $mbar \cdot l \cdot s^{-1}$. In a typical mass spectrometer, volume 3 connected to this port contains an ion cooling multipole or ion tunnel, though a mass selecting means, in particular a linear quadrupole mass filter, could also be located there. Depending on the ion source, a gas flow rate of 0.3-0.6 $mbar \cdot l \cdot s^{-1}$ can also occur.

Pumping port 24 is evacuated to $3 \times 10^{-5}$ mbar with a pumping speed of 150 $l \cdot s^{-1}$ at an incoming gas flow rate of $4 \times 10^{-3}$ $mbar \cdot l \cdot s^{-1}$. In a typical mass spectrometer, volume 4 connected to this port contains a mass selector such as a quadrupole mass filter, a linear ion trap, or a time-of-flight mass analyzer and also may include a collision cell, the collision cell containing a locally relatively high pressure of gas, some of which escapes the cell and is pumped through pumping port 24. Volume 4 also could contain an RF-only gas-filled storage device such as a C-trap, used for containing ions and ejecting them to a mass analyzer such as an Orbitrap™ or a multi-reflection time-of-flight analyzer.

Pumping port 26 is evacuated to $5 \times 10^{-7}$ mbar with a pumping speed of 20 $l \cdot s^{-1}$ at an incoming gas flow rate of $5 \times 10^{-6}$ $mbar \cdot l \cdot s^{-1}$. The first part of a high-voltage lens system may be located within volume 5 connected to pumping port 26. Higher pumping speed here is not needed because the function of ion optics within volume 5 is to separate ions from the effusive gas jet emanating from the C-trap device and then guide them to the next pumped volume. The port 26 is substantially slot shaped.

Pumping port 28 is evacuated to $2 \times 10^{-8}$ mbar with a pumping speed of 10 $l \cdot s^{-1}$ at an incoming gas flow rate of $1 \times 10^{-7}$ $mbar \cdot l \cdot s^{-1}$. Lenses preceding a high-resolution analyzer are located within volume 6 connected to pumping port 28. Here high pumping speed is also not needed because the length of the ion optical path within volume 6 needs to be minimized and therefore higher pumping speed barely affects the actual pressure along the ion axis. The port 28 is substantially slot shaped. Channel 85 is also pumped by pumping port 28, as will be further described.

The ports 26, 28 being substantially slot shaped are smaller than the remaining ports 22, 24 and 30. The slot shaped ports have associated pumping speeds less than 30 $l \cdot s^{-1}$. The larger ports 22, 24 and 30 have associated pumping speeds more than 50 $l \cdot s^{-1}$. The pumping system generally may have one or more, preferably two or more, substantially slot shaped ports, which may be associated with respective stages of pumping having pumping speeds less than 30 $l \cdot s^{-1}$.

Pumping port 30 is adjacent the ultimate vacuum region of the turbomolecular pump arrangement and a pressure of $<2 \times 10^{-10}$ mbar is achieved at working gas loads. Pumping port 30 evacuates volume 7 containing the mass analyzer, and conducts a gas flow rate of $1 \times 10^{-9}$ mbar. $l \cdot s^{-1}$ at a pumping speed of 200 $l \cdot s^{-1}$. The pressure in the final pumping stage is measured by vacuum pressure gauge 50. The mass analyzer is preferably of the Orbitrap™ or multi-reflection/multi-deflection time-of-flight or electrostatic trap types. A mass analyzer of the orbitrap type is for example disclosed in U.S. Pat. No. 5,886,346. Ultra-high vacuum is essential for correct operation of such analyzers because it ensures survival of labile multiply-charged proteins up to the end of mass analysis process in spite of their high kinetic energy (corresponding to 1 to 30 kV of acceleration).

Split-flow turbomolecular pump 15 comprises a motor 70, a drag pumping stage 72, and five stages of rotor and stator blades, 74, 75, 76, 77, 78.

Housing 14 is sealed to housing 12 in regions adjacent the pumping ports. Elastomer seals 80 provide gas-tight seals around pumping ports 20, 22 and 24. Metal to metal seals 81 are utilised around pumping ports 26, 28 and 30. FIG. 1 depicts a preferred embodiment in which pumping port 28 surrounds pumping port 30 such that pumping port 30 seals against pressure within pumping port 28 and not against atmosphere. This is facilitated by channel 85 which is pumped by pumping port 28 and which surrounds pumping port 30. By this means, regions of housings 12 and 14 adjacent pumping port 30 need not contain elastomer seals but may use a metal to metal seal of a type which does not cause plastic deformation of the metallic sealing material, whilst providing UHV at the pumping port. Similar seals are used to seal pumping ports 26 and 28, and this concentric pumping arrangement eliminates the difficulties found when attempting leak-tight sealing using plastic deformation of multiple seals in parallel.

While the turbomolecular pump of FIG. 1 has its own housing 14, it is also possible to eliminate multiple O-rings 80 by making it of a cartridge type. In this case stators are encapsulated in a metal cage which slides into housing 12 and makes leaks between pumping stages negligible mainly by tight tolerances of the fit (though in some cases Viton™ or V-shaped soft metal rings could be used).

As used herein, including in the claims, unless the context indicates otherwise, singular forms of the terms herein are to be construed as including the plural form and vice versa.

Throughout the description and claims of this specification, the words "comprise", "including", "having" and "contain" and variations of the words, for example "comprising" and "comprises" etc, mean "including but not limited to", and are not intended to (and do not) exclude other components.

It will be appreciated that variations to the foregoing embodiments of the invention can be made while still falling within the scope of the invention. Each feature disclosed in this specification, unless stated otherwise, may be replaced by alternative features serving the same, equivalent or similar purpose. Thus, unless stated otherwise, each feature disclosed is one example only of a generic series of equivalent or similar features.

The use of any and all examples, or exemplary language ("for instance", "such as", "for example" and like language) provided herein, is intended merely to better illustrate the invention and does not indicate a limitation on the scope of the invention unless otherwise claimed. No language in the specification should be construed as indicating any non-claimed element as essential to the practice of the invention.

All of the features disclosed in this specification may be combined in any combination, except combinations where at least some of such features and/or steps are mutually exclusive. In particular, the preferred features of the invention are applicable to all aspects of the invention and may be used in any combination. Likewise, features described in non-essential combinations may be used separately (not in combination).

The invention claimed is:

1. A mass spectrometer system comprising:

an ion source;

a mass analyzer;

an ion optical arrangement for transporting ions from the ion source to the mass analyzer; and a vacuum pump system for evacuating at least 5 volumes of the mass spectrometer, the vacuum pump system comprising a forevacuum pump and a turbomolecular pump arrangement, the system arranged so that the forevacuum pump pumps an output of the turbomolecular pump arrangement to atmosphere, and wherein the turbomolecular pump arrangement comprises multiple pumping ports corresponding to different pumping stages and is configured so that:

there are at least 5 pumping stages, each connected to a respective volume; each pumping stage is separated by at least one set of rotor blades and at least one set of stator blades;

not more than 3 pumping stages have pumping speeds in excess of ⅓ of the highest pumping speed of a pumping stage when under vacuum and/or a pumping port cross section in excess of ⅓ of the biggest pumping port cross section;

at least 2 pumping stages have pumping speeds less than ¼ of the highest pumping speed of a pumping stage when under vacuum and/or a pumping port cross section of less than ¼ of the biggest pumping port cross section;

wherein when under vacuum the total range of pressures across all volumes pumped by the turbomolecular pump arrangement spans at least 8 orders of magnitude and the volume at the lowest pressure is maintained below $1\times10^{-9}$ mbar.

2. The mass spectrometer system of claim 1, wherein at least one pumping stage of the turbomolecular pump arrangement contains a molecular drag pump.

3. The mass spectrometer system of claim 2, wherein the molecular drag pump is a Holweck pump with a helical pump channel.

4. The mass spectrometer system of claim 1, wherein not more than 3 pumping stages have pumping speed in excess of 50 $ls^{-1}$ when under the vacuum; at least 2 pumping stages have pumping speeds less that 30 $ls^{-1}$ when under vacuum; and wherein the forevacuum pump when in use maintains the output of the turbomolecular pump arrangement at a pressure of 1 mbar or more.

5. The mass spectrometer system of claim 1, wherein when in use at working gas loads the ratio of pressures between any two adjacent pumping stages of the turbomolecular pump arrangement is between 10 and 1000.

6. The mass spectrometer system of claim 1, wherein the greatest distance between any two pumping stages of the molecular pump arrangement is less than 400 mm.

7. The mass spectrometer system of claim 1, wherein the pumping stage connected to the volume at the lowest pressure has the highest pumping speed when under vacuum and/or the biggest pumping port cross section.

8. The mass spectrometer system of claim 1, wherein at least the volume at the lowest pressure is equipped with a heating arrangement for heating the volume, and wherein preferably the sealing of the volume at the lowest pressure does not contain elastomer seals.

9. The mass spectrometer system of claim 1, wherein at least one pumping port surrounds a second pumping port such that the second pumping port seals against pressure within the first pumping port and not against atmosphere, or wherein at least the volume of a first pumping stage surrounds the volume of a second pumping stage such that the volume of the second pumping stage seals against pressure within the first pumping stage and not against atmosphere.

10. The mass spectrometer system of claim 1, wherein the volume with the lowest pressure when under vacuum contains the mass analyzer.

11. The mass spectrometer system of claim 10, wherein the mass analyzer is a multi-reflection/multi deflection time of flight or electrostatic trap type mass analyzer of orbitrap type mass analyzer.

12. The mass spectrometer system of claim 1, wherein the ion optical arrangement comprises at least one mass filter and/or at least one ion trap and/or at least one collision cell.

13. The mass spectrometer system of claim 1, wherein at least one first volume pumped by a pumping stage of the turbomolecular pump arrangement surrounds the volume with the lowest pressure when under vacuum, such that the volume at the lowest pressure seals against pressure within the first volume and not against atmosphere, and wherein the volume at the lowest pressure is equipped with metallic seals and with a heating arrangement for heating the volume.

14. The mass spectrometer system of claim 1, wherein the turbomolecular pump arrangement spans 8 to 10 orders of magnitude.

15. A method of evacuating at least 5 volumes of a mass spectrometer system comprising an on source, a mass analyzer and an on optical arrangement for transporting ions from the ion source to the mass analyzer, the method comprising: pumping an output of a turbomolecular pump arrangement to atmosphere with a forevacuum pump; and pumping each volume via a respective one of at least 5 pumping stages of the turbomolecular pump arrangement; wherein each pumping stage is separated by at least one set of rotor blades and at least one set of stator blades; not more than 3 pumping stages have pumping speeds in excess of ⅓ of the highest pumping speed when under vacuum; at least 2 pumping stages have pumping speeds less than ¼ of the highest pumping speed when under vacuum; wherein when pumping at working gas loads the total range of pressures across all volumes pumped by the turbomolecular pump arrangement spans at least 8 orders of magnitude and the volume at the lowest pressure is maintained below $1\times10^{-9}$ mbar.

16. The method of claim 15, wherein the at least 5 volumes comprise chambers connected by apertures and/or elongated flow restrictors, which chambers house ion optical components of a mass spectrometer, and wherein the ion optical components comprise at least one ion trap and/or at least one collision cell and/or at least one mass filter.

17. The method of claim 15, wherein the turbomolecular pump arrangement spans 8 to 10 orders of magnitude.

* * * * *